(12) United States Patent
Lee et al.

(10) Patent No.: US 11,476,404 B2
(45) Date of Patent: *Oct. 18, 2022

(54) ULTRASONIC SENSING DEVICE AND THE MANUFACTURING METHOD THEREOF

(71) Applicant: Qian Jun Technology Ltd., Zhubei (TW)

(72) Inventors: Chi-Shen Lee, Zhubei (TW); Yu-Yen Fu, Zhubei (TW); Po-Chun Yeh, Zhubei (TW); Dong-Fu Chen, Zhubei (TW); Chih-Wen Cheng, Zhubei (TW); Chi-Lin Huang, Zhubei (TW); Yu-Ping Yen, Hsinchu (TW)

(73) Assignee: Qian Jun Technology Ltd., Zhubei (TW)

( * ) Notice: Subject to any disclaimer, the term of this patent is extended or adjusted under 35 U.S.C. 154(b) by 367 days.

This patent is subject to a terminal disclaimer.

(21) Appl. No.: 16/795,605

(22) Filed: Feb. 20, 2020

(65) Prior Publication Data

US 2020/0395529 A1 Dec. 17, 2020

(30) Foreign Application Priority Data

Jun. 12, 2019 (TW) ................................ 108120233

(51) Int. Cl.
*H01L 41/053* (2006.01)
*H01L 41/113* (2006.01)
*H01L 41/23* (2013.01)
*H01L 41/25* (2013.01)

(52) U.S. Cl.
CPC ........ *H01L 41/053* (2013.01); *H01L 41/1132* (2013.01); *H01L 41/23* (2013.01); *H01L 41/25* (2013.01)

(58) Field of Classification Search
CPC ...................................................... H01L 41/053
USPC ............................................................. 73/649
See application file for complete search history.

(56) References Cited

U.S. PATENT DOCUMENTS

| 8,794,071 | B2* | 8/2014 | Inoue | B60R 19/483 73/649 |
|---|---|---|---|---|
| 2004/0168518 | A1* | 9/2004 | Fukuda | G01S 13/931 73/632 |
| 2005/0188768 | A1* | 9/2005 | Hayashi | G10K 11/004 73/649 |
| 2013/0026884 | A1* | 1/2013 | Kim | H01L 41/053 310/315 |

(Continued)

*Primary Examiner* — Joseph Chang

(57) ABSTRACT

An ultrasonic sensing device includes a housing, a piezoelectric assembly, a board and a plurality of fixing members. The housing includes a bottom wall, a top wall and a surrounding side wall connected between the top wall and the bottom wall. The piezoelectric assembly includes an encapsulating body and a piezoelectric sheet, wherein at least a portion of the piezoelectric sheet is enclosed by the encapsulating body and has a sensing surface exposed to the encapsulating body and facing the bottom wall. The board is disposed on the top wall of the housing and has a pressing surface facing the encapsulating body and the top wall. The plurality of fixing members is configured to fix the board to the top wall of the housing to press the board to the encapsulating body of the piezoelectric assembly, thereby pressing the sensing surface of the piezoelectric sheet to the bottom wall.

14 Claims, 6 Drawing Sheets

(56) References Cited

U.S. PATENT DOCUMENTS

2020/0393292 A1* 12/2020 Fu .......................... H01L 41/23
2020/0393413 A1* 12/2020 Fu ...................... H01L 41/1132

* cited by examiner

ULTRASONIC SENSING DEVICE AND THE MANUFACTURING METHOD THEREOF

FIELD OF THE INVENTION

The present invention relates to a sensing device and the manufacturing method thereof, and more particularly to an ultrasonic sensing device including a piezoelectric assembly and the manufacturing method thereof.

BACKGROUND OF THE INVENTION

A diesel engine needs to be equipped with Selective catalytic reduction (SCR) to reduce toxic hydronitrogen (NOx) emission. SCR can neutralize the toxic hydronitrogen by adding urea to the diesel fuel to convert the toxic hydronitrogen into water and nitrogen. When the concentration of urea in the diesel is insufficient, the diesel engine may have too much hydronitrogen emission.

The urea used in the diesel engine may be mixed with water and stored in a storage tank adjacent to the diesel engine. Usually, a plurality of ultrasonic detecting devices can be arranged beside the storage tank to detect the urea concentration or liquid level of the urea in the storage tank.

The conventional ultrasonic sensing device primarily comprises a housing and a piezoelectric sheet placed in the housing. In order to attach the piezoelectric sheet to the sensing surface in the housing, it is necessary to inject an encapsulant into the housing after placing the piezoelectric sheet in the housing.

However, sometimes the adhesive force of the encapsulant may be not able to tightly attach the piezoelectric sheet to the sensing surface, therefore causing reliability issue of the conventional ultrasonic sensing device.

In addition, it is always difficult to precisely control the amount of the encapsulant for the process of injecting the encapsulant into the housing, thereby causing material waste. Moreover, it is also difficult to control the quality of the piezoelectric sheet and the encapsulant in the housing or rework them.

SUMMARY OF THE INVENTION

The present invention provides an ultrasonic sensing device having high reliability.

The present invention provides a manufacturing method of an ultrasonic sensing device, which is convenient to control quality and perform reworking of a piezoelectric assembly, and the material cost during the manufacturing process can be reduced.

The present invention provides an ultrasonic sensing device including a housing, a piezoelectric assembly, a board and a plurality of fixing members. The housing includes a bottom wall, a top wall and a surrounding side wall connected between the top wall and the bottom wall. The top wall has an opening formed at the position where the top wall is connected with the surrounding side wall, and the opening is opposite to the bottom wall. The piezoelectric assembly includes an encapsulating body and a piezoelectric sheet, wherein at least a portion of the piezoelectric sheet is enclosed by the encapsulating body, the encapsulating body is disposed on the bottom wall and surrounded by the surrounding side wall, and the piezoelectric sheet has a sensing surface exposed to the encapsulating body and facing the bottom wall. The board is disposed on the top wall of the housing and has a pressing surface facing the encapsulating body and the top wall. The plurality of fixing members is configured to fix the board to the top wall of the housing to press the board to the encapsulating body of the piezoelectric assembly, thereby pressing the sensing surface of the piezoelectric sheet to the bottom wall.

The present invention provides a manufacturing method of an ultrasonic sensing device, which includes steps of:
 a) providing the mentioned housing.
 b) providing a piezoelectric sheet, and placing the piezoelectric sheet on the bottom through the opening of the top wall.
 c) injecting a liquid colloid into the opening.
 d) covering a board on the top wall of the housing.
 e) fixing the board to the top wall by a plurality of fixing members to press the board to the colloid, thereby pressing the piezoelectric sheet to the bottom wall.

The present invention provides a manufacturing method of an ultrasonic sensing device, which includes steps of:
 a) providing the mentioned housing.
 b) providing the mentioned piezoelectric assembly.
 c) disposing the piezoelectric assembly on the bottom wall with a direction that sensing surface facing the bottom wall.
 d) covering a board on the top wall of the housing.
 e) fixing the board to the top wall by a plurality of fixing members to press the board to the encapsulating body of the piezoelectric assembly, thereby pressing the sensing surface of piezoelectric sheet to the bottom wall.

In an embodiment of the present invention, the board is bent or flat.

In an embodiment of the present invention, the board is a circuit board.

In an embodiment of the present invention, the board has a single material or a composite material.

In an embodiment of the present invention, the piezoelectric assembly further includes a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

In an embodiment of the present invention, wherein the encapsulating body is adhered to the surrounding side wall.

In an embodiment of the present invention, the encapsulating body has a surrounding shape conformed to the surrounding side wall.

In an embodiment of the present invention, the piezoelectric assembly further includes a matching layer or a conducting layer disposed on the sensing layer of the piezoelectric sheet and corresponding to vibration energy of the piezoelectric sheet.

In an embodiment of the present invention, each of the plurality of fixing members is a screw, the board has a plurality of through holes, and the top wall has a plurality of screw holes.

In an embodiment of the present invention, the ultrasonic sensing device further includes an outer frame and a cover. The outer frame surrounds and connects to the top wall and the surrounding side wall of the housing and extends in a direction away from the bottom wall, the outer frame has an opening at an end away from the bottom wall, and the cover closes the opening.

In an embodiment of the present invention, the ultrasonic sensing device further includes a reflective board and a plurality of connecting rods. The reflective board is disposed opposite to the housing and the outer frame, and each of the plurality of connecting rods is connected between the reflective board and the outer frame.

In an embodiment of the present invention, the encapsulating body includes a matching layer and/or an absorbing layer corresponding to vibration energy of the piezoelectric sheet.

In the ultrasonic sensing device of the embodiments of the present invention, a board is used to press the encapsulating body, so that the piezoelectric is abutted against the bottom wall of the housing. Comparing with the conventional piezoelectric sheet merely connected to the housing by an encapsulant, the piezoelectric sheet of the embodiments of the present invention can be more tightly disposed on the bottom wall of the housing, thereby improving the reliability.

In the manufacturing method of an ultrasonic sensing device of the embodiments of the present invention, the encapsulating body and the piezoelectric sheet are integrated as a module in advance before being placed into the housing. The material of the encapsulating body can be injected into a dedicated mold for the convenience of quality control and rework, and the amount of the injecting material can be precisely controlled to avoid unnecessary material waste.

Other objectives, features and advantages of the invention will be further understood from the further technological features disclosed by the embodiments of the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
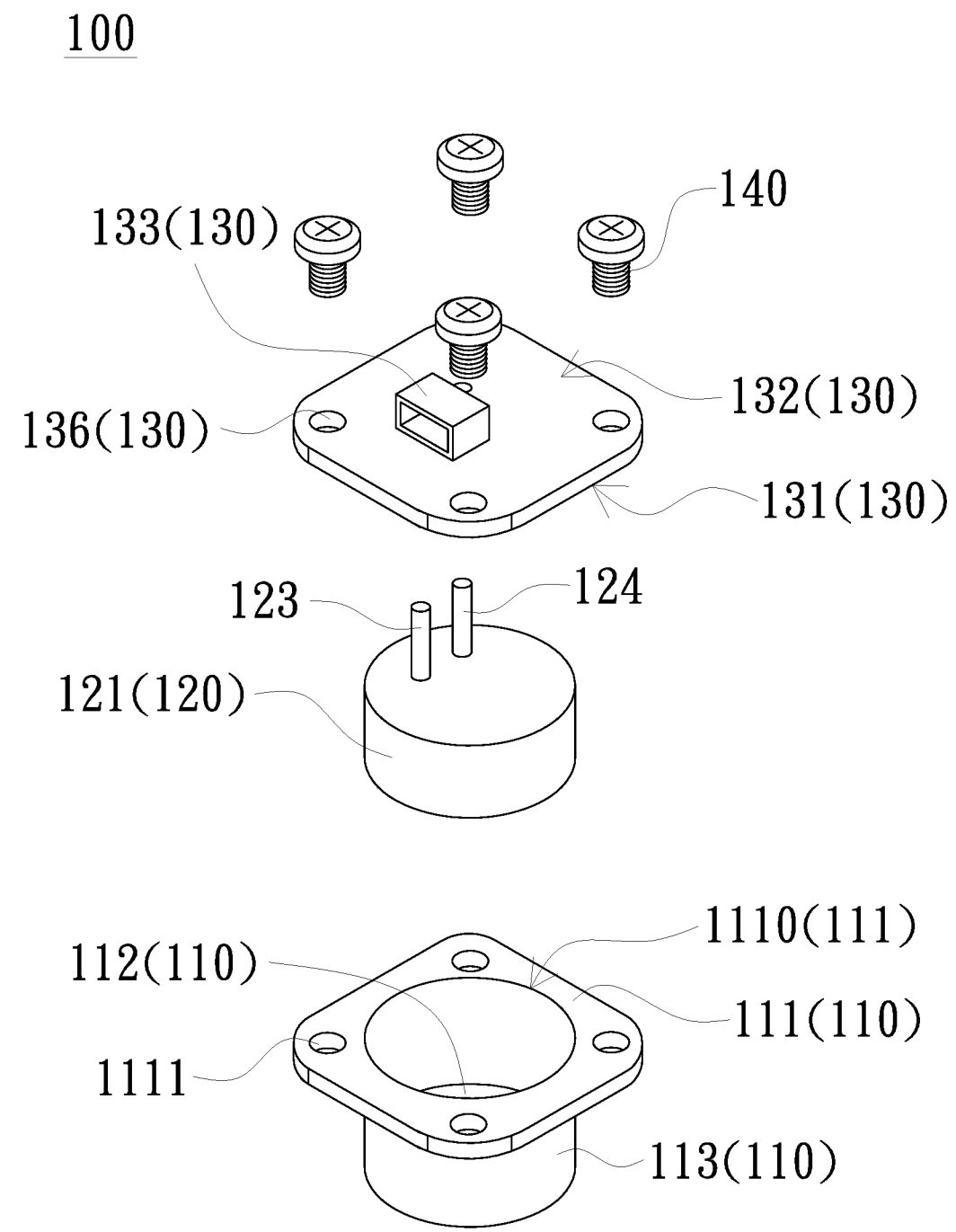
FIG. 1A is a schematic exploded view of an ultrasonic sensing device of an embodiment of the present invention.
Figure 1B:
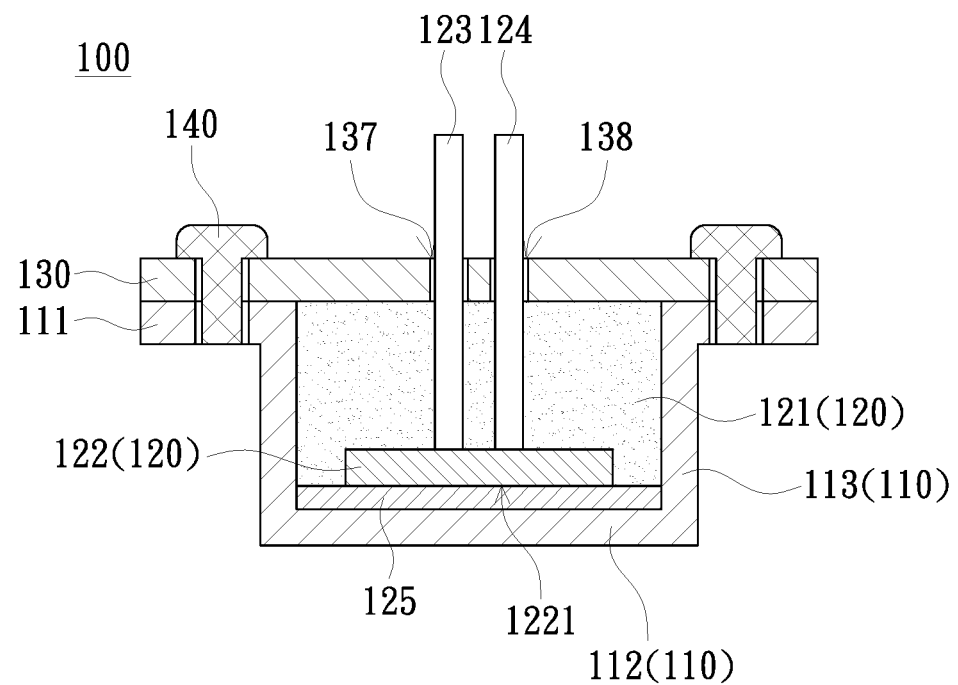
FIG. 1B is a schematic cross-sectional view of an ultrasonic sensing device of an embodiment of the present invention.

FIG. 1A is a schematic exploded view of an ultrasonic sensing device of an embodiment of the present invention. FIG. 1B is a schematic cross-sectional view of an ultrasonic sensing device of an embodiment of the present invention. Please refer to FIGS. 1A and 1B. An ultrasonic sensing device 100 of the present embodiment includes a housing 110, a piezoelectric assembly 120, a board 130 and a plurality of fixing members 140. The housing 110 includes a top wall 111, a bottom wall 112 and a surrounding side wall 113 connected between the bottom wall 112 and the top wall 111. The top wall 111 has an opening 1110 formed at the position where the top wall 111 is connected with the surrounding side wall 113, and the opening 1110 is opposite to the bottom wall 112. The piezoelectric assembly 120 includes an encapsulating body 121 and a piezoelectric sheet 122, wherein at least a portion of the piezoelectric sheet 122 is enclosed by the encapsulating body 121. The encapsulating body 121 is disposed on the bottom wall 112 and surrounded by the surrounding side wall 113. The piezoelectric sheet 122 has a sensing surface 1221 exposed to the encapsulating body 121 and facing the bottom wall 112. The board 130 is disposed on the top wall 111 of the housing 110 and has a pressing surface 131 facing the encapsulating body 121 and the top wall 111. The plurality of fixing members 140 is configured to fix the board 130 to the top wall 111 of the housing 110 to press the board 130 to the encapsulating body 121 of the piezoelectric assembly 120, thereby pressing the sensing surface 1221 of the piezoelectric sheet 122 to the bottom wall 112.

In the present embodiment, the board 130 may have a single material or a composite material. In the present embodiment, the board 130 may be a circuit board. For example, the board 130 may further include a disposing surface 132 opposite to the pressing surface 131, and a connector 133 may be disposed on the disposing surface 132 of the board 130 to electrically connect to an external device (not shown).

Figure 1C:
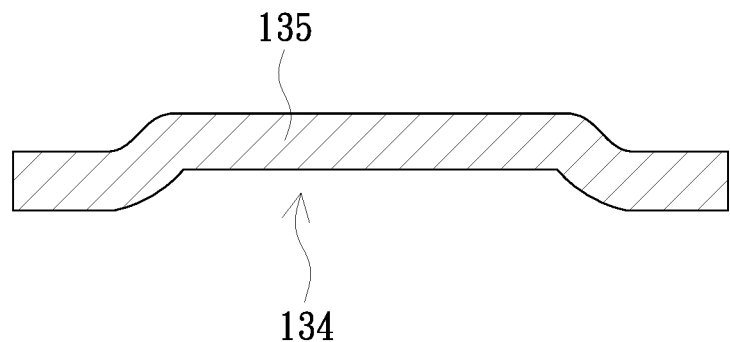
FIG. 1C is a schematic diagram of a board of an embodiment of the present invention.

In the present embodiment, the board 130 is flat, but is not limited thereto. For example, FIG. 1C illustrates a board 130a in a bent shape. The board 130a has a concave portion 134 on a side and a corresponding convex portion 135 on the other side. The encapsulating body 121 may abut against the concave portion 134 when the encapsulating body 121 protrudes from the opening 1110. Alternatively, the encapsulating body 121 may abut against the convex portion 135 when the encapsulating body 121 is recessed in the opening 1110 of the top wall 111.

In the present embodiment, the encapsulating body 121 and the piezoelectric sheet 122 of the piezoelectric assembly 120 may be combined in a mold in advance, and therefore a manufacturing method of the ultrasonic sensing device 100 of the present embodiment may include steps of: a) providing the housing 110; b) providing the piezoelectric assembly 120; c) disposing the piezoelectric assembly 120 on the bottom wall 112 of the housing 110; d) covering the board 130 on the top wall 111; and e) fixing the board 130 to the top wall 111 by the plurality of fixing members 140.

In the present embodiment, the encapsulating body 121 of the piezoelectric assembly 120 has a surrounding shape conformed to the surrounding side wall 113, such as the round shape as shown in FIG. 1A, but is not limited thereto. The encapsulating body 121 may be conformed to the surrounding side wall 113 with other shapes such as polygon. The encapsulating body 121 may include a matching layer and/or an absorbing layer corresponding to vibration energy of the piezoelectric sheet 122. The material of the matching layer and/or the absorbing layer may include epoxy, SiOx or other colloid.

In the present embodiment, the piezoelectric assembly 120 further includes a colloid layer 125 disposed on the sensing layer 1221 of the piezoelectric sheet 122. The colloid layer 125 may be a matching layer or a conducting layer corresponding to vibration energy of the piezoelectric sheet 122.

In the present embodiment, the piezoelectric assembly 120 may further include a positive guide pin 123 having an end connected to the piezoelectric sheet 122 and a negative guide pin 124 having an end connected to the piezoelectric sheet 122. The positive guide pin 123 and the negative guide pin 124 pass through the encapsulating body 121. The board 130 has an opening 137 and an opening 138 allowing the positive guide pin 123 and the negative guide pin 124 to pass therethrough respectively. The positive guide pin 123 and the negative guide pin 124 may connect to an external power supply (not shown).

In the present embodiment, each of the plurality of fixing members 140 is a screw, the board 130 has a plurality of through holes 136, and the top wall 111 of the housing 110 has a plurality of screw holes 1111. The board 130 can be fixed to the top wall 111 and pressed to the encapsulating body 121 by locking the fixing members 140 to the screw holes 1111. The number of the fixing members 140 is at least three for balancing the downward pressure on the board 130.

In the present embodiment, the material of the housing 110 may be metal such as stainless steel, aluminum alloy or other alloy, but is not limited thereto. The material of the housing 110 may be also polyamide (PA), polyethylene (PE) or polypropylene (PP).

The ultrasonic sensing device 100 of the present embodiment can be placed in a liquid. For example, the ultrasonic sensing device 100 and a waveguide tube (not shown) may be incorporated to detect a level of the liquid, or the ultrasonic sensing device 100 and a reflective board may be disposed opposite to detect a concentration of the liquid.

In the ultrasonic sensing device 100 of the present embodiment, the board 130 is used to press the encapsulating body 121, so that the piezoelectric sheet 122 is abutted against the bottom wall 112 of the housing 110. Comparing with the conventional piezoelectric sheet merely connected to the housing by an encapsulant, the piezoelectric sheet 122 of the present embodiment can be more tightly disposed on the bottom wall 112 of the housing 110, thereby improving the reliability.

In the manufacturing method of the ultrasonic sensing device 100 of the present embodiment, the encapsulating body 121 and the piezoelectric sheet 122 are integrated as a module in advance before being placed into the housing 110. The material of the encapsulating body 121 can be injected into a dedicated mold for the convenience of quality control and rework, and the amount of the injecting material can be precisely controlled to avoid unnecessary material waste.

FIGS. 2A to 2D are schematic diagrams of a manufacturing method of an ultrasonic sensing device of another embodiment of the present invention. The manufacturing method of an ultrasonic sensing device 100a including following steps.

Figure 2A:
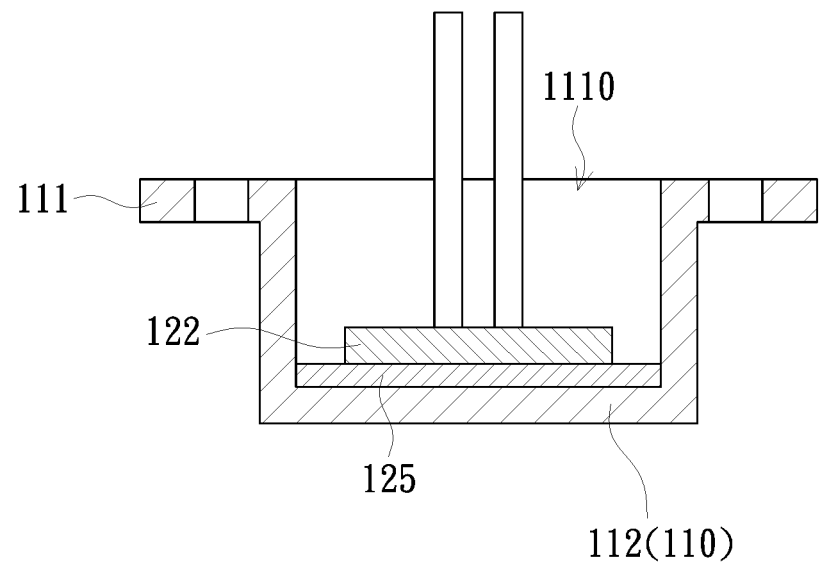
FIGS. 2A to 2D are schematic diagrams of a manufacturing method of an ultrasonic sensing device of another embodiment of the present invention.

Please refer to FIG. 2A first. The housing 110 of FIG. 1A is provided. Then, the colloid layer 125 is disposed to cover the bottom 112 of the housing 110. Then, the piezoelectric sheet 122 is disposed in the housing 110 and placed on the bottom wall 112 via the opening 1110. The colloid layer 125 can provide a preliminary positioning to the piezoelectric sheet 122.

Figure 2B:
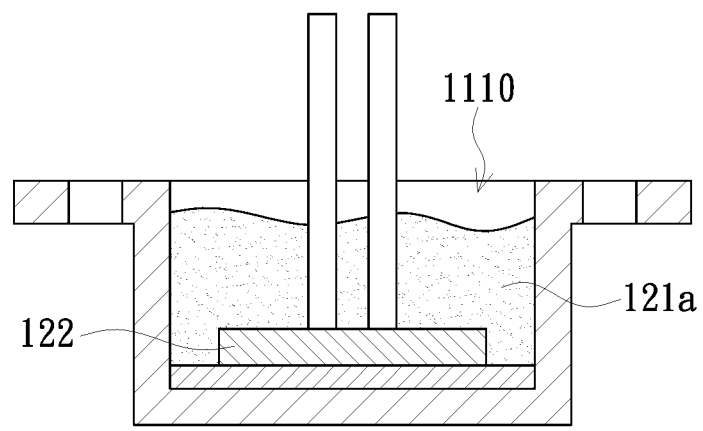

Please refer next to FIG. 2B. A liquid colloid 121a is injected into the opening 1110 to cover the piezoelectric sheet 122. The colloid 121a can be a state before the encapsulating body 121 of FIG. 1A is cured.

Figure 2C:
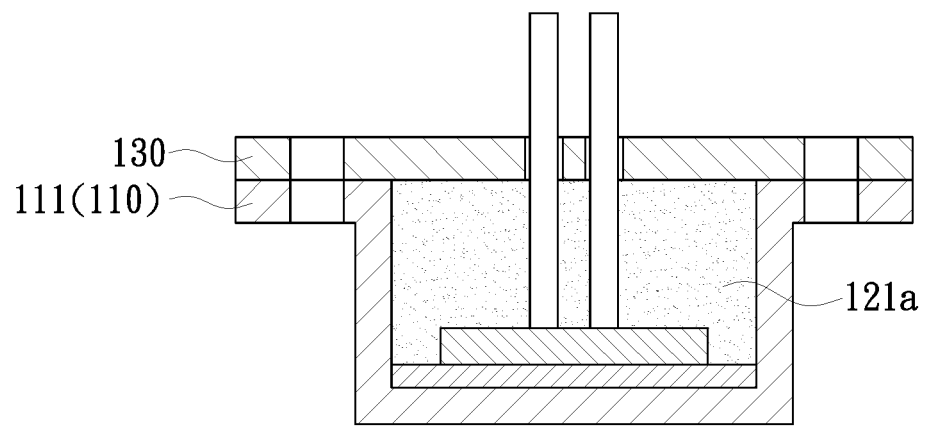

Please refer next to FIG. 2C. The board 130 of FIG. 1A is provided to cover the top wall 111 of the housing 110. The board 130 can be disposed before or after the colloid 121a is cured as needed.

Figure 2D:
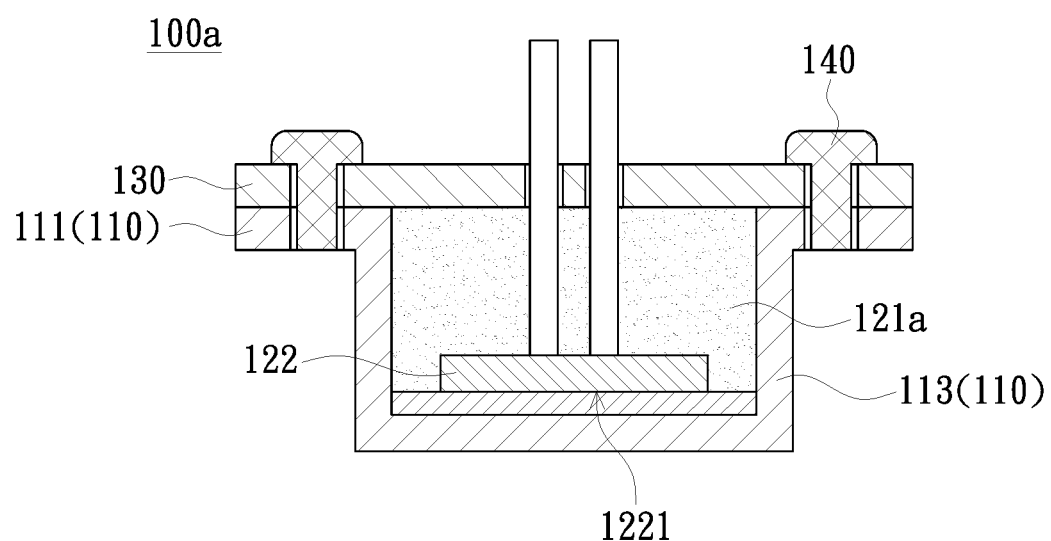

Please refer next to FIG. 2D. The fixing members 140 are used to fix the board 130 to the top wall 111 to press the board 130 to the colloid 121a, thereby pressing the sensing surface 1221 of the piezoelectric sheet 122 to the bottom wall 112. The ultrasonic sensing device 100a of the present embodiment is manufactured after the colloid 121a is cured to the encapsulating body of FIG. 1A.

The ultrasonic sensing device 100a of the present embodiment is similar to the ultrasonic sensing device 100 of FIG. 1A. The difference is that the encapsulating body 121 of the present embodiment is cured in the housing 110, and therefore the encapsulating body 121 may be adhered to the surrounding side wall 113 of the housing 110.

Figure 3:
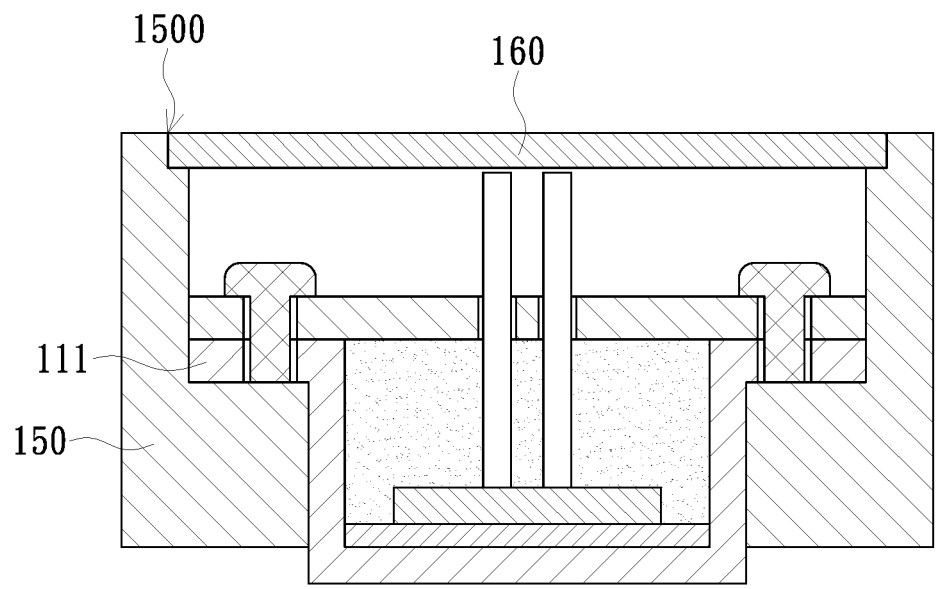
FIG. 3 is a schematic cross-sectional view of an ultrasonic sensing device of another embodiment of the present invention.

FIG. 3 is a schematic cross-sectional view of an ultrasonic sensing device of another embodiment of the present invention. Please refer to FIG. 3. The ultrasonic sensing device 100b of the present embodiment is similar to the ultrasonic sensing device 100 of FIG. 1A. The difference is that the ultrasonic sensing device 100b of the present embodiment further includes an outer frame 150 and a cover 160. The outer frame 150 surrounds and connects to the top wall 111 and the surrounding side wall 113 of the housing 110. The outer frame 150 further extends in a direction away from the bottom wall 112. The outer frame 150 has an opening 1500 at an end away from the bottom wall 112, and the cover closes the opening 1500. A variety of connecting mechanisms such as adhesion, fastening or screw lock, can be applied to connect the cover 160 to the outer frame 150 as needed.

Figure 4:
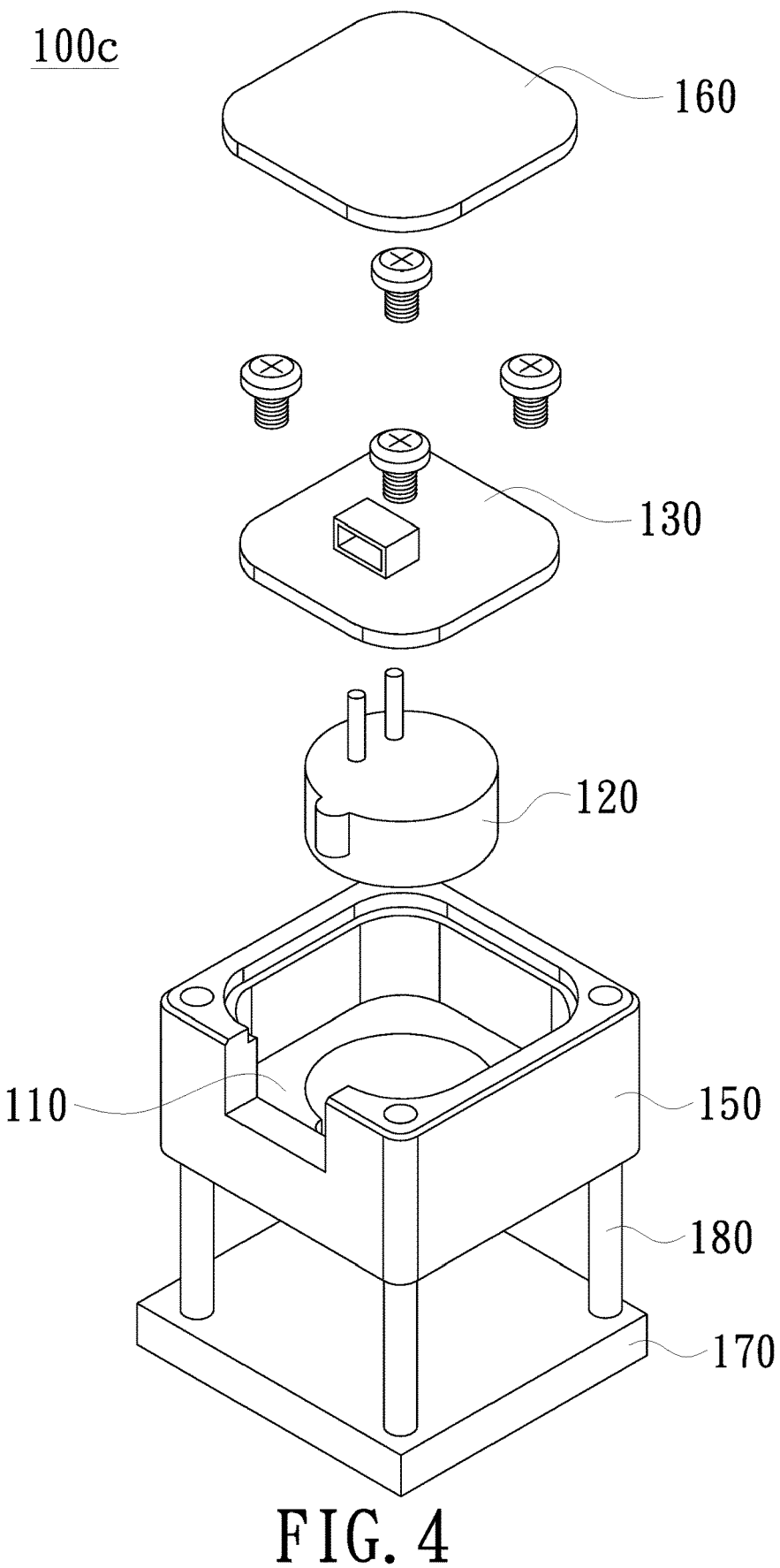
FIG. 4 is a schematic exploded view of an ultrasonic sensing device of another embodiment of the present invention.

FIG. 4 is an exploded schematic view of an ultrasonic sensing device of another embodiment of the present invention. Please refer to FIG. 4. The ultrasonic sensing device 100c of the present embodiment is similar to the ultrasonic sensing device 100b of FIG. 3. The difference is that the ultrasonic sensing device 100c of the present embodiment further includes a reflective board 170 and a plurality of connecting rods 180. The reflective board 170 is disposed opposite to the housing 110 and the outer frame 150. Each of the plurality of connecting rods 180 is connected between the reflective board 170 and the outer frame 150. The reflective board 170 can be used to reflect vibration signal of the piezoelectric assembly 120 to detect the concentration of a liquid.

In the ultrasonic sensing device of the embodiments of the present invention, a board is used to press the encapsulating body, so that the piezoelectric sheet is abutted against the bottom wall of the housing. Comparing with the conventional piezoelectric sheet merely connected to the housing by an encapsulant, the piezoelectric sheet of the embodiments of the present invention can be more tightly disposed on the bottom wall of the housing, thereby improving the reliability.

In the manufacturing method of the ultrasonic sensing devices of the embodiments of the present invention, the encapsulating body and the piezoelectric sheet are integrated as a module in advance before being placed into the housing. The material of the encapsulating body can be injected into a dedicated mold for the convenience of quality control and rework, and the amount of the injecting material can be precisely controlled to avoid unnecessary material waste.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An ultrasonic sensing device, comprising:
   a housing, comprising a bottom wall, a top wall and a surrounding side wall connected between the top wall and the bottom wall, wherein the top wall has an opening formed at the position where the top wall is connected with the surrounding side wall, and the opening is opposite to the bottom wall;
   a piezoelectric assembly, comprising an encapsulating body and a piezoelectric sheet, wherein at least a portion of the piezoelectric sheet is enclosed by the encapsulating body, the encapsulating body is disposed on the bottom wall and surrounded by the surrounding side wall, and the piezoelectric sheet has a sensing surface exposed to the encapsulating body and facing the bottom wall;
   a board, disposed on the top wall of the housing and has a pressing surface facing the encapsulating body and the top wall; and
   a plurality of fixing members, configured to fix the board on the top wall of the housing to press the board to the encapsulating body of the piezoelectric assembly, thereby pressing the sensing surface of the piezoelectric sheet to the bottom wall.

2. The ultrasonic sensing device according to claim 1, wherein the board is bent or flat.

3. The ultrasonic sensing device according to claim 1, wherein the board is a circuit board.

4. The ultrasonic sensing device according to claim 1, wherein the board has a single material or a composite material.

5. The ultrasonic sensing device according to claim 1, wherein the piezoelectric assembly further comprises a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

6. The ultrasonic sensing device according to claim 1, wherein the encapsulating body is adhered to the surrounding side wall.

7. The ultrasonic sensing device according to claim 1, wherein the encapsulating body has a surrounding shape conformed to the surrounding side wall.

8. The ultrasonic sensing device according to claim 1, wherein the piezoelectric assembly further comprises a matching layer or a conducting layer disposed on the sensing layer of the piezoelectric sheet and corresponding to vibration energy of the piezoelectric sheet.

9. The ultrasonic sensing device according to claim 1, wherein each of the plurality of fixing members is a screw, the board has a plurality of through holes, and the top wall has a plurality of screw holes.

10. The ultrasonic sensing device according to claim 1, further comprising an outer frame and a cover, wherein the outer frame surrounds and connects to the top wall and the surrounding side wall of the housing and extends in a direction away from the bottom wall, the outer frame has an opening at an end away from the bottom wall, and the cover closes the opening.

11. The ultrasonic sensing device according to claim 10, further comprising a reflective board and a plurality of connecting rods, wherein the reflective board is disposed opposite to the housing and the outer frame, and each of the plurality of connecting rods is connected between the reflective board and the outer frame.

12. The ultrasonic sensing device according to claim 1, wherein the encapsulating body comprises a matching layer and/or an absorbing layer corresponding to vibration energy of the piezoelectric sheet.

13. A manufacturing method of an ultrasonic sensing device, comprising steps of:
   providing a housing, wherein the housing comprises bottom wall, a top wall and a surrounding side wall connected between the top wall and the bottom wall, wherein the top wall has an opening where the surrounding side wall is connected with, and the opening is opposite to the bottom wall;
   providing a piezoelectric sheet and disposing the piezoelectric sheet on the bottom wall through the opening of the top wall;
   injecting a liquid colloid into the opening;
   covering a board on the top wall of the housing; and
   fixing the board to the top wall by a plurality of fixing members to press the board to the colloid, thereby pressing the piezoelectric sheet to the bottom wall.

14. A manufacturing method of an ultrasonic sensing device, comprising steps of:
   providing a housing, wherein the housing comprises bottom wall, a top wall and a surrounding side wall connected between the top wall and the bottom wall, wherein the top wall has an opening where the surrounding side wall is connected with, and the opening is opposite to the bottom wall;
   providing a piezoelectric assembly, wherein the piezoelectric assembly comprises an encapsulating body and a piezoelectric sheet, wherein at least a portion of the piezoelectric sheet is enclosed by the encapsulating body, the encapsulating body is disposed on the bottom wall and surrounded by the surrounding side wall, and the piezoelectric sheet has a sensing surface exposed to the encapsulating body and facing the bottom wall;
   disposing the piezoelectric assembly on the bottom wall with a direction that sensing surface facing the bottom wall;
   covering a board on the top wall of the housing; and
   fixing the board to the top wall by a plurality of fixing members to press the board to the encapsulating body of the piezoelectric assembly, thereby pressing the sensing surface of the piezoelectric sheet to the bottom wall.

* * * * *